United States Patent
Alam et al.

(10) Patent No.: US 12,165,684 B2
(45) Date of Patent: *Dec. 10, 2024

(54) MIDPOINT SENSING REFERENCE GENERATION FOR STT-MRAM

(71) Applicant: Everspin Technologies, Inc., Chandler, AZ (US)

(72) Inventors: Syed M. Alam, Austin, TX (US); Yaojun Zhang, Austin, TX (US); Frederick Neumeyer, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/297,793

(22) Filed: Apr. 10, 2023

(65) Prior Publication Data

US 2023/0245692 A1    Aug. 3, 2023

Related U.S. Application Data

(63) Continuation of application No. 17/113,595, filed on Dec. 7, 2020, now Pat. No. 11,651,807.

(51) Int. Cl.
*G11C 11/16* (2006.01)

(52) U.S. Cl.
CPC ...... *G11C 11/1673* (2013.01); *G11C 11/1659* (2013.01); *G11C 11/1657* (2013.01)

(58) Field of Classification Search
None
See application file for complete search history.

(56) References Cited

U.S. PATENT DOCUMENTS

| | | | |
|---|---|---|---|
| 6,331,943 B1 | 12/2001 | Naji et al. | |
| 6,445,612 B1 | 9/2002 | Naji | |
| 6,791,887 B2 | 9/2004 | Hung et al. | |
| 8,902,641 B2 * | 12/2014 | Chih | G11C 11/16 365/158 |
| 2002/0080644 A1 | 6/2002 | Ito | |

(Continued)

FOREIGN PATENT DOCUMENTS

EP    1564750 B1    6/2011

OTHER PUBLICATIONS

T. Andre et al., "ST-MRAM Fundamentals, Challenges, and Applications," Proceedings of the IEEE 2013 Custom Integrated Circuits Conference, San Jose, CA, 2013, pp. 1-8, doi: 10.1109/CICC.2013.6658449.

(Continued)

*Primary Examiner* — J. H. Hur
(74) *Attorney, Agent, or Firm* — Bookoff McAndrews, PLLC

(57) ABSTRACT

The present disclosure is drawn to a magnetoresistive device including an array of memory cells arranged in rows and columns, each memory cell comprising a magnetic tunnel junction, each row comprising a word line, and each column comprising a bit line; a column select device that selects a bit line. The magnetoresistive device also includes a sense amplifier comprising a first input corresponding to a selected bit line, a second input corresponding to a reference bit line, and a data output. The plurality of columns comprise a reference column, the reference column comprising a conductive element coupled to the magnetic tunnel junctions in the reference column.

20 Claims, 8 Drawing Sheets

(56) References Cited

U.S. PATENT DOCUMENTS

| | | |
|---|---|---|
| 2003/0223268 A1 | 12/2003 | Tanizaki et al. |
| 2004/0047184 A1 | 3/2004 | Tran et al. |
| 2005/0078537 A1 | 4/2005 | So et al. |
| 2005/0180205 A1 | 8/2005 | Park et al. |
| 2019/0348118 A1* | 11/2019 | Antonyan .......... G11C 16/0433 |

OTHER PUBLICATIONS

T. Andre et al., "ST-MRAM Fundamentals, Challenges, and Outlook," 2017 IEEE International Memory Workshop (IMW), Monterey, CA, 2017, pp. 1-4, doi: 10.1109/IMW.2017.7939104.

* cited by examiner

MIDPOINT SENSING REFERENCE GENERATION FOR STT-MRAM

CROSS-REFERENCE TO RELATED APPLICATION(S)

This patent application is a continuation of and claims the benefit of priority to U.S. Nonprovisional patent application Ser. No. 17/113,595, filed on Dec. 7, 2020, the entirety of which is incorporated herein by reference.

TECHNICAL FIELD

Embodiments of the present disclosure relate to magnetoresistive devices. More specifically, embodiments of the present disclosure relate to circuits and methods for midpoint sensing reference generation in spin transfer torque magnetoresistive memory.

INTRODUCTION

A memory system may include a memory device for storing data and a host (or controller) for controlling operations of the memory device. In general, memory devices may be classified into volatile memory (such as, e.g., dynamic random-access memory (DRAM), static random-access memory (SRAM), etc.) and non-volatile memory (such as, e.g., electrically erasable programmable read-only memory (EEPROM), ferroelectric random-access memory (FRAM), phase-change memory (PRAM), magnetoresistive memory (MRAM), resistive random-access memory (RRAM/ReRAM), flash memory, etc.).

A magnetoresistive stack or a magnetic tunnel junction (MTJ) used in MRAM includes at least one non-magnetic layer (for example, at least one dielectric layer or a non-magnetic yet electrically conductive layer) disposed between a "fixed" magnetic region and a "free" magnetic region, each including one or more layers of ferromagnetic materials. Information is stored in the magnetoresistive memory stack by switching, programming, and/or controlling the direction of magnetization vectors in the magnetic layer(s) of the free magnetic region. The direction of the magnetization vectors of the free magnetic region may be switched and/or programmed (for example, through spin orbit torque (SOT) and/or spin transfer torque (STT)) by application of a write signal (e.g., one or more current pulses) adjacent to, or through, the magnetoresistive memory stack.

In particular, an STT-MRAM device stores information by controlling the resistance across an MTJ such that a read current through the MTJ results in a voltage drop having a magnitude that is based on the state of the magnetoresistive stack. The resistance in each MTJ can be varied based on the relative magnetic states of the magnetoresistive layers within the magnetoresistive stack. In such memory devices, there is typically a portion of magnetoresistive stack that has a fixed magnetic state and another portion that has a free magnetic state that is controlled to be either one of two possible states relative to the portion having the fixed magnetic state. Because the resistance through the MTJ changes based on the orientation of the free portion relative to the fixed portion, information can be stored by setting the orientation of the free portion. The information is later retrieved by sensing the orientation of the free portion.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein; however, all permutations and combinations are considered to fall within the scope of the present disclosure.

Figure 1:
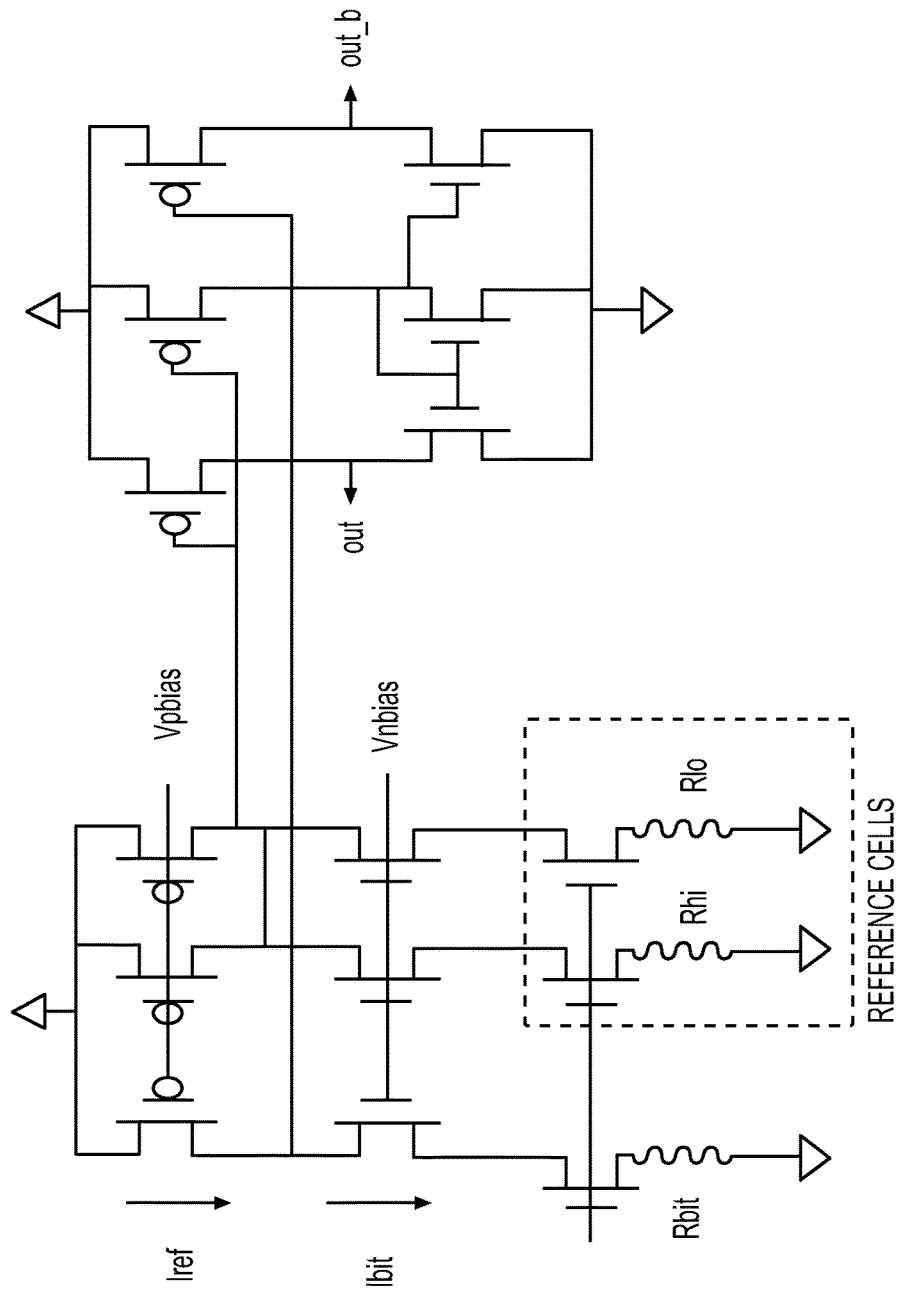
FIG. 1 depicts an exemplary schematic diagram of a midpoint generator used in a toggle MRAM device.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved. In some aspects, one or more described features or steps may be omitted altogether, or may be performed with an intermediate step therebetween, without departing from the scope of the embodiments described herein, depending upon the functionality/acts involved.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described.

In one aspect, the present disclosure is directed to techniques and implementations for midpoint sensing reference generation in STT-MRAM devices. Though the description below makes reference to MRAM devices, the inventions may be implemented in other memory devices including, but not limited to, EEPROM, FRAM, PRAM, RRAM/ReRAM and/or flash memory.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in or otherwise contemplated with respect to an embodiment of described the subject matter.

Writing to magnetic memory cells can be accomplished by sending a spin-polarized write current through the memory cell where the angular momentum carried by the spin-polarized current can change the magnetic state of the free portion of the magnetic tunnel junction. One of ordinary skill in the art understands that such a current can either be directly driven through the memory cell or can be the result of applying one or more voltages, where the applied voltages result in the desired current. Depending on the direction of the current through the memory cell, the resulting magnetization of the free portion will either be parallel or antiparallel to the fixed portion. If the parallel orientation represents a logic "0", the antiparallel orientation represents a logic "1", or vice versa. Thus, the direction of write current flow through the memory cell determines whether the memory cell is written to a first state or a second state. In such memories, the magnitude of the write current is typically greater than the magnitude of a read current used to sense the information stored in the memory cells.

Each memory cell typically includes a magnetic tunnel junction coupled in series with a corresponding selection transistor that allows each memory cell to be individually selected for access. In some architectures, each memory cell is coupled between two common lines, which are often referred to as a bit line and a source line. A memory array typically includes many bit lines and source lines that allow selective access to subsets of the memory cells within the array. Word lines are coupled to the gates of the selection transistors, thereby controlling current flow through the series circuit of each memory cell based on the voltages applied to the ends of the magnetic memory cell by, for example, the bit lines and source lines.

With reference now to FIG. 1, there is depicted an exemplary schematic diagram of a midpoint generator used in a toggle MRAM device. Midpoint sensing with a toggle MRAM uses a parallel connection of high-state and low-state MTJs (i.e., the components designated as Rhi and Rlo in FIG. 1) in a sense amplifier. A current may be measured for the high-state MTJ and the low-state MTJ, and the sum of the currents for the high-state MTJ and the low-state MTJ may be divided by two to determine a midpoint sensing reference.

Figure 2:
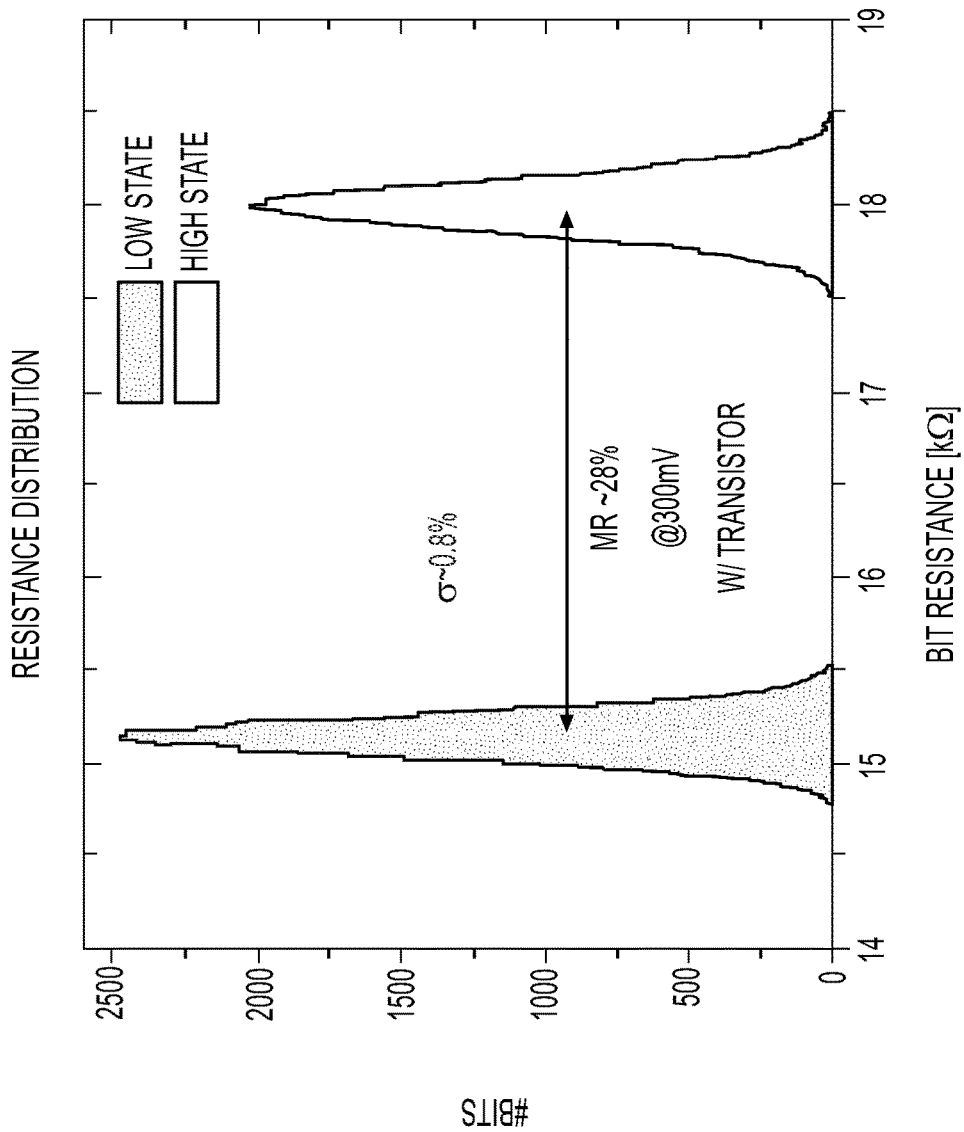
FIG. 2 depicts an exemplary graph illustrating a resistance distribution for a toggle MRAM device.

FIG. 2 depicts an exemplary graph illustrating a resistance distribution for a toggle MRAM device. In particular, the graph plots resistances of the low-state and high-state MTJs (or bits) against a corresponding number of MTJs. Midpoint sensing generally uses a reference, which can be identified in the graph. For instance, the reference may be at the midpoint between the distribution of low-state MTJs and the distribution of high-state MTJs. Magnetoresistance Ratio (MR) may refer to a percentage increase in resistance from a low resistance state to a high resistance state. The reference in between the distributions may be obtained using the circuitry (i.e., midpoint generator) illustrated in FIG. 1.

Figure 3:
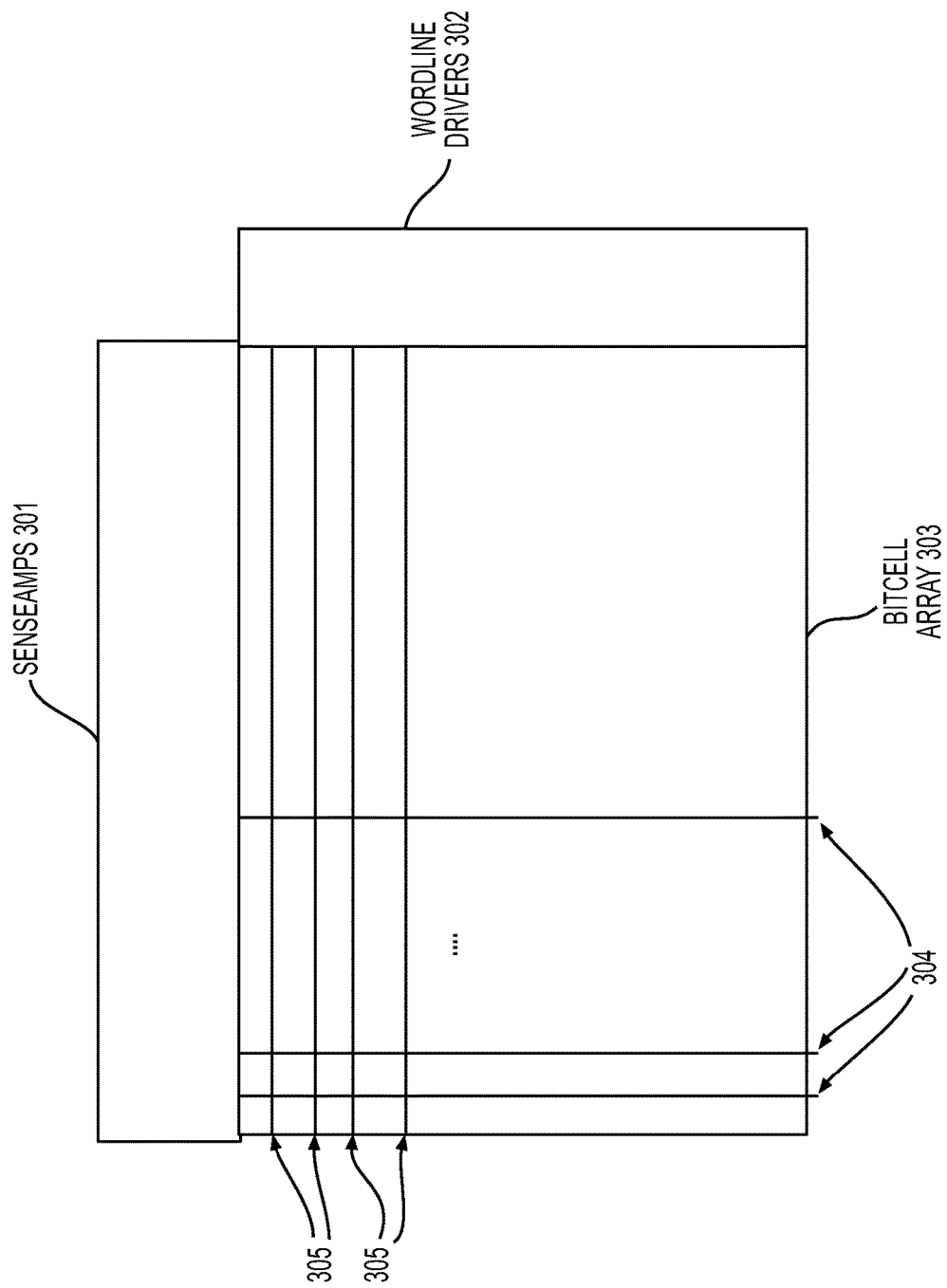
FIG. 3 depicts an exemplary diagram illustrating an array structure of a toggle MRAM device.

FIG. 3 depicts an exemplary diagram illustrating an array structure of a toggle MRAM device. The bit cell array 303 includes bit lines 304 and word lines 305. The sense amplifiers 301 are connected to the plurality of bit lines 304 to provide appropriate voltages to certain bit lines 304 used to perform an operation (e.g., write, read, etc.). Word line drivers 302 generate appropriate word line voltages for word lines 305, in order to select/activate one or more word lines 305 to access MTJ(s) along the selected word line(s) 305. In general, the bit cell array 303 includes a plurality of columns (e.g., one or more sets of 32 or 64 columns), with each column including a plurality of MTJs each coupled to a corresponding select transistor and a bit line 304. The bit cell array 303 also includes a plurality of rows (e.g., one or more sets of 256 rows), each including a corresponding word line 305. An additional reference row for midpoint sensing may be added for every predetermined number of regular rows (e.g., one reference row for every 256 regular rows), such that each reference row is not positioned too far away from the bit cells. Likewise, an additional reference bit line may be added for every predetermined number of regular bit lines 304 (e.g., one reference bit line for every 32 or 64 regular bit lines 304), such that each reference bit line is positioned not too far away from the bit cells. The arrangement of the reference rows and the reference bit lines illustrated in FIG. 3 may be applicable to a toggle MRAM device without any significant degradation in performance because, once the reference is set to be high and low, those states are maintained unless there is an interference from an external magnetic field. Such arrangement may not be feasible in, for example, STT-MRAM devices due to various performance reasons, which will be explained in greater detail below.

Figure 4:
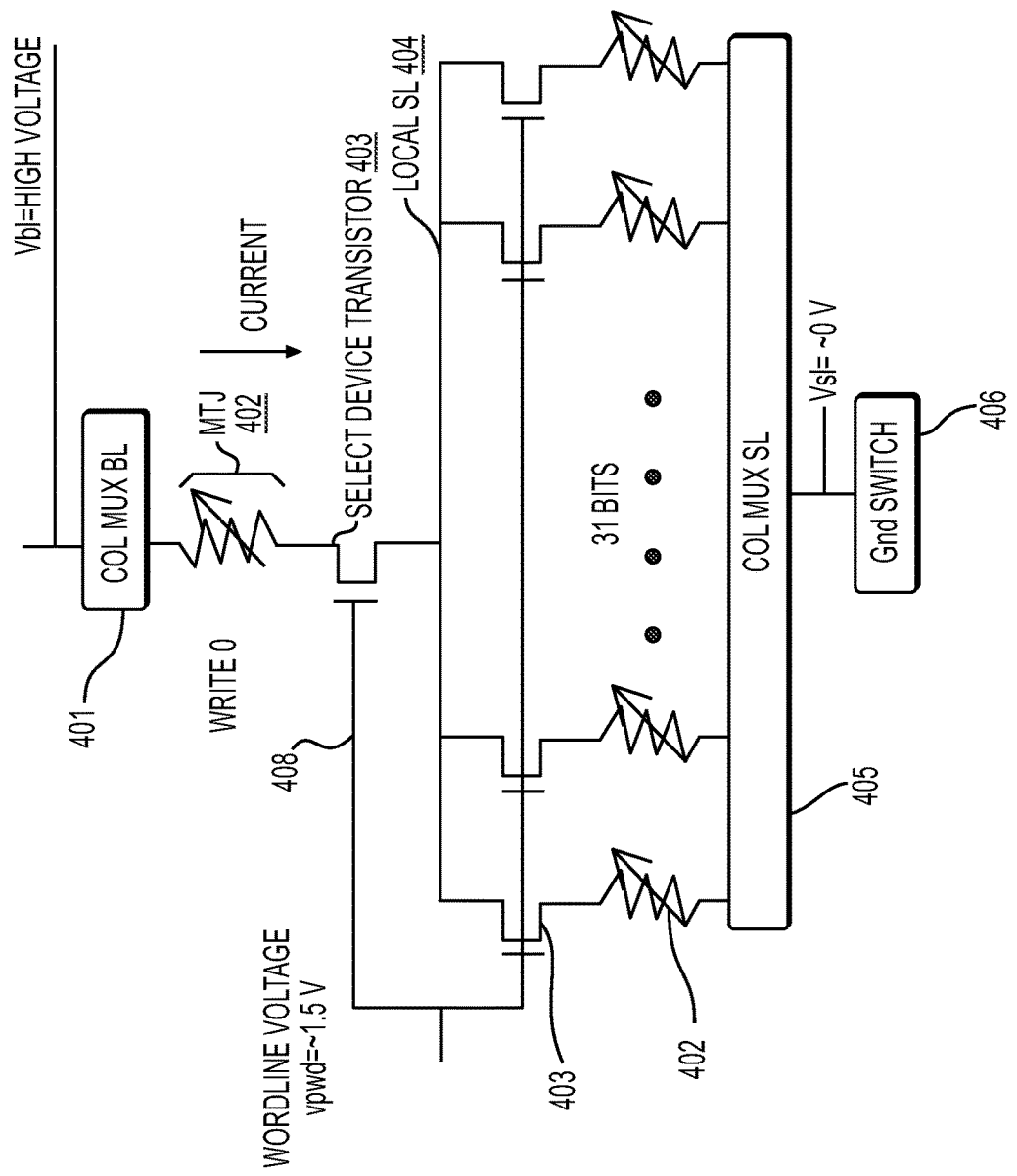
FIG. 4 illustrates an exemplary schematic diagram illustrating a local source line array architecture of an STT-M RAM device.

FIG. 4 illustrates an exemplary schematic diagram illustrating a local source line array architecture of an STT-MRAM device. The STT-MRAM device may include a column multiplexer, comprising a bit line multiplexer 401 and a source line multiplexer 405. The bit line multiplexer 401 may be configured to receive a bit line voltage (Vbl) that is generally high. The source line multiplexer 405 may be configured to receive a source line voltage (Vsl) of approximately 0 volts or a ground voltage, which may be provided by a ground switch 406. Voltage is applied to the word line 408 that corresponds to the row including the target MTJ 402. Each magnetic bit cell may include an MTJ 402 and a select transistor 403 coupled thereto. A local source line 404 may be shared across the row of bit cells (e.g., 32 bit cells), the select transistor 403 of each bit cell situated on the same row being coupled to the shared local source line 404. The current path for a Write 0 or low state (e.g., down write direction) operation is shown in FIG. 4, which illustrates that the current travels from the bit line multiplexer 401 toward a MTJ 402 selected using the column multiplexer. FIG. 4 illustrates a local source line architecture using a single word line 408. Array of magnetic bit cells may include a plurality of word lines, an example of which is illustrated in FIG. 5.

Figure 5:
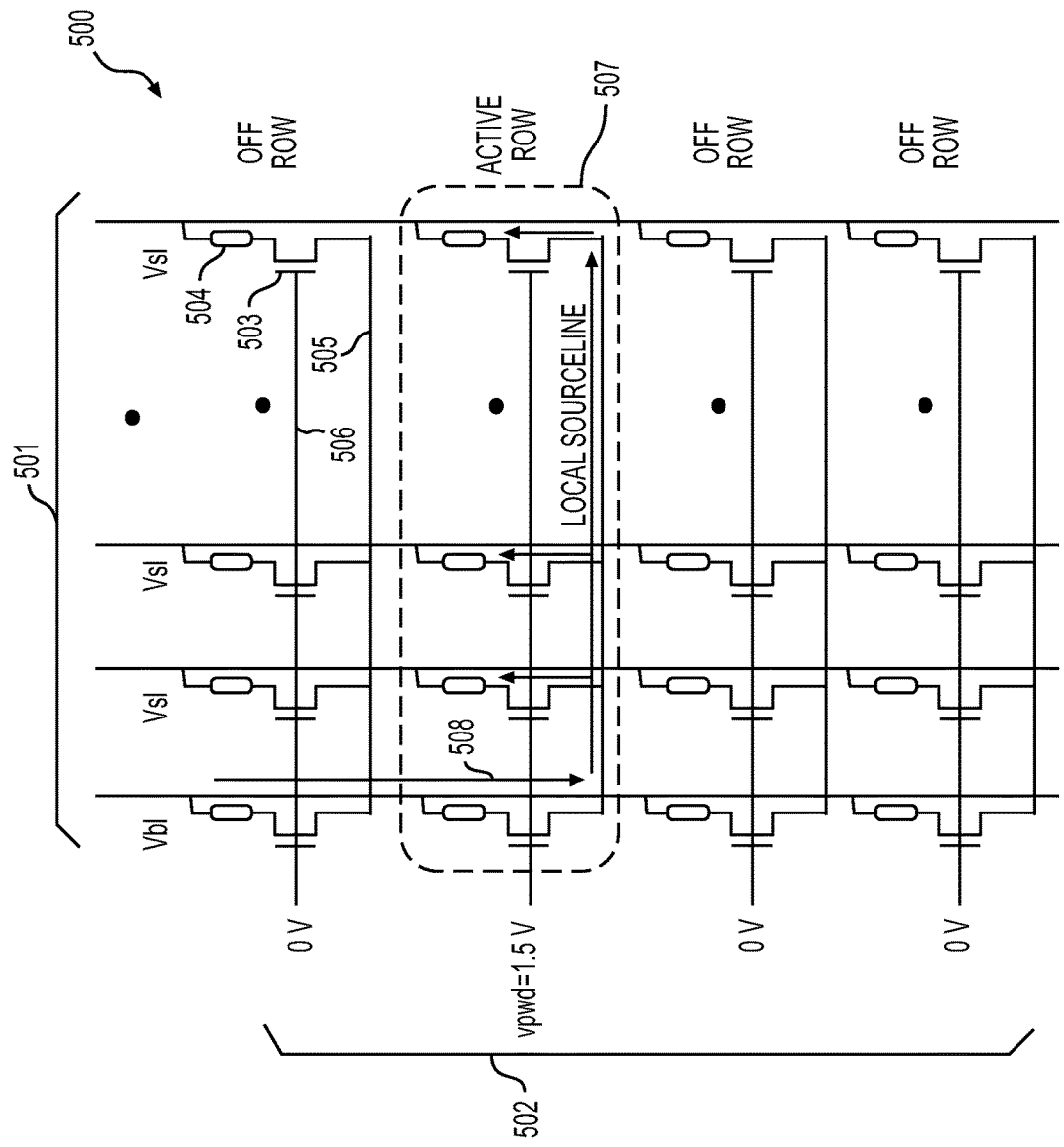
FIG. 5 illustrates another exemplary schematic diagram illustrating a local source line array architecture of an STT-M RAM device.

FIG. 5 illustrates another exemplary schematic diagram illustrating a local source line array architecture of an STT-MRAM device. As shown in FIG. 5, the array structure 500 of an STT-MRAM device may include a plurality of columns 501 and a plurality of rows 502, with each column including a plurality of magnetic bit cells. Each magnetic bit cell may include a select transistor 503 and an MTJ 504. Each MTJ may be coupled between a bit line and a first electrode (e.g., a source) of a select transistor, while a second electrode (e.g., a drain) of each select transistor may be coupled to a local source line 505 that runs horizontally across the row in which the MTJ is positioned. The local source line may thus be shared across all or a certain number (e.g. 32 bit cells) MTJs positioned in that row. A control electrode (e.g., a gate) of each select transistor may be coupled to a word line driver configured to apply voltage to a selected word line or row. Each row may contain a single word line 506 that connects to the control electrodes (e.g., gates) of all select transistors positioned across that row.

The local source line may be a lower level metal layer, and the local source line may be shared among a group of select transistors (e.g., 32 select transistors) situated on the same row. During a read operation, current travels down the bit line to the active row 507 (i.e., the row selected by the word line driver and to which word line voltage is applied), travels through the corresponding local source line, and travels back up through neighboring bit cells via the respective bit lines, as indicated by the arrows 508 in FIG. 5. In other words, the read is performed in a downward direction on a bit line, and the local source line provides for a return path up the other bit lines. The bit lines may be on a high level metal layer (e.g., Metal 4) with low resistance.

Because the return path includes MTJ devices, if a reference column and a corresponding reference row are added to the array according to FIG. 3 array structure of a toggle MRAM device, and the reference column does not have the same MTJ devices as the other columns, a systematic offset may be introduced. Further, the states of MTJs in the return path may cause a mismatch with the reference column during midpoint sensing. To reduce a mismatch, the reference MTJs for midpoint sensing should be placed near the MTJ that is being read. Furthermore, the reference high and low-state MTJs may lose state due to data retention and a read voltage disturbance.

Although a poly resistor may be used for a reference, a poly resistor may be too large to fit in a bit cell array, such as the array shown in FIG. 5. Further, placing the poly resistor outside the bit cell array may not track the word line position for bit line resistance and regular bit line leakage. Additionally, poly resistors may not have voltage and current characteristics identical to those of a regular MTJ. For example, a poly resistor may not track the resistance and MR temperature coefficient of a regular MTJ. Furthermore, a poly resistor may not provide any way to cancel return path MTJ resistance in a local source line array. An exemplary embodiment illustrated in FIG. 6 may minimize or alleviate one or more of the above problems associated with adding a reference region and/or using poly resistors for midpoint reference generation in STT-MRAM devices.

Figure 6:
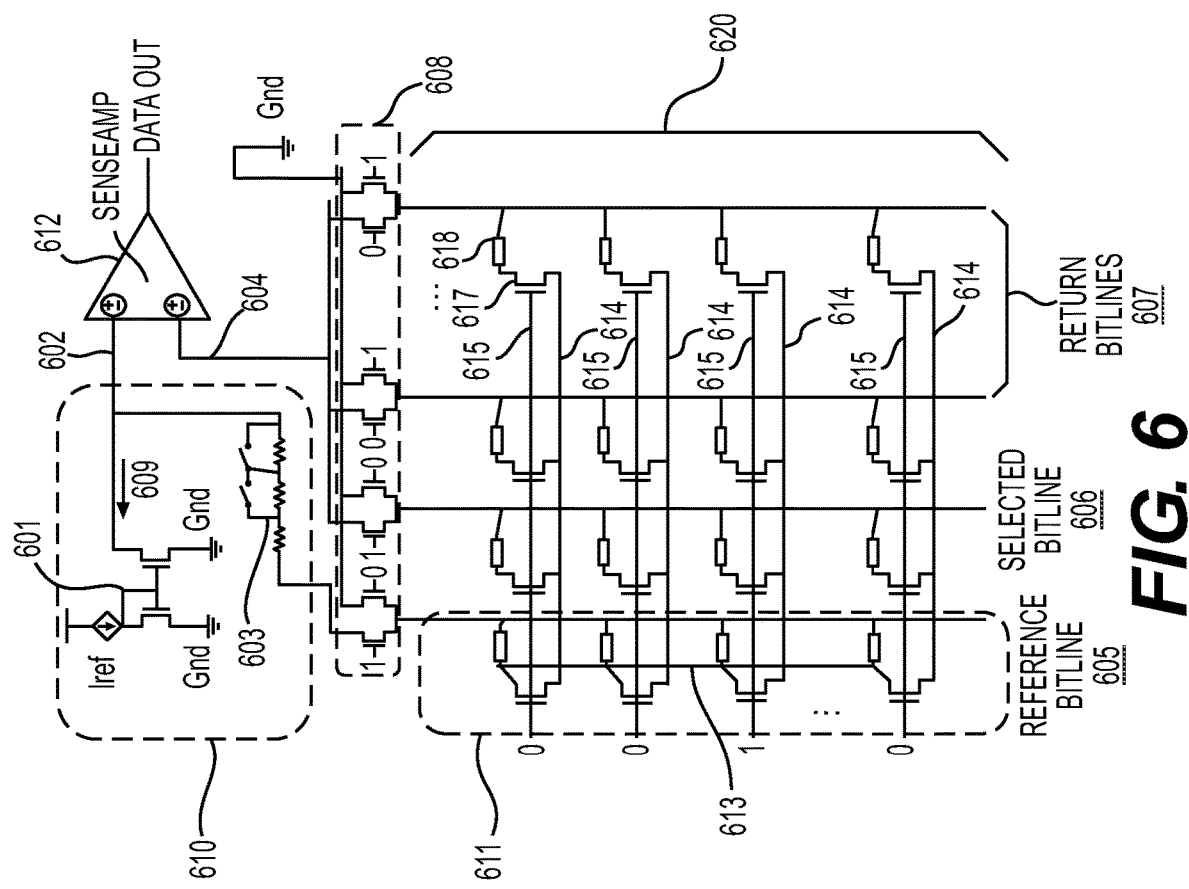
FIG. 6 depicts an exemplary schematic diagram illustrating a local source line array architecture of an STT-MRAM device configured for midpoint sensing, according to an aspect of the present disclosure.

FIG. 6 depicts an exemplary schematic diagram illustrating a local source line array architecture of an STT-MRAM device configured for midpoint sensing, according to an aspect of the present disclosure. An STT-MRAM bit cell array 620 (i.e., the bit lines of the array 620) may be coupled to column selection circuitry 608, which may in turn be coupled to a sense amplifier 612. Specifically, a plurality of bit lines in the array 620, including the selected bit line 606 and return bit lines 607, may be connected to an input 604 of the sense amplifier 612 through the column selection circuitry 608. Further, a reference bit line 605 in the array 620 may be connected to an input 602 of the sense amplifier 612 through the column selection circuitry 608 and a tracking circuitry 610. The bit cell array 620 may include a plurality of columns, with each column including a plurality of MTJs 618 and select transistors 617 coupled thereto. Notably, the plurality of columns include a reference column 611 configured for midpoint reference generation. The bit cell array 620 may also include a plurality of rows, with each row including a local source line 614 and a plurality of MTJs 618 connected to the local source line 614 via the respective select transistors 617.

The local source lines 614 may be extended into the reference column 611 and may be connected to the respective second electrodes of the select transistors 617. For example, for every predetermined number of columns (e.g., 32 columns), a reference column 611, including a reference bit line 605 and MTJs 618 connected to the reference bit line 605, may be added as an additional column (e.g., a 33$^{rd}$ column). An advantage of placing a reference bit cell on a same local source line as the other MTJ devices positioned on the same row is that the return path has the same MTJ devices, thus improving uniformity. Additionally, the return path MTJ resistance is present in both reference and regular bit lines during sensing.

Furthermore, the reference column 611 may include an element 613 connected across the MTJs 618 in the reference column 611. According to an exemplary embodiment, the element 613 may be a bridge element (e.g., M3 bridge). In other words, the bridge element 613 may be formed at the $3^{rd}$ metal layer of the STT-MRAM device. However, any metal layer may be used for the bridge element 613. In some embodiments, any conductive layer may be used for the bridge element 613.

With the bridge element 613 connected across the MTJs 618, all of the MTJs 618 in the reference column 611 are shorted, and the effective resistance of each MTJ 618 becomes small as it is divided by the number of MTJs (e.g., 512) in the reference column 611. Thus, the STT-MRAM device may use the MTJs 618 in the reference column 611 without having any significant impact from the resistance of the MTJs. The MTJs 618 in the reference column 611 does not need to set or reset to high or low states. Furthermore, the shared local source line 614 in the reference column 611 enables the same return path for the reference column 611. According to another exemplary embodiment, the reference column 611 may include a plurality of shorted MTJ devices, in lieu of using a bridge element. According to yet another exemplary embodiment, the reference column 611 may not include any MTJs and there may be a short connecting the reference bit line 605 directly to select transistors 617 in the reference bit line 605. According to yet another exemplary embodiment, the array 620 may include a plurality of reference bit lines 605 with the bridge elements 613, to reduce the return path MTJ resistance even further.

The STT-MRAM device may also include circuit elements for adjusting a temperature coefficient of the current on the reference bit line 605. For example, the column selection circuitry 608 connected to the reference bit line 605 may in turn be connected to a circuit element 603 within the tracking circuitry 610. According to an exemplary embodiment, the circuit element 603 may comprise one or more poly resistors (e.g., a chain of poly resistors with trim capabilities in multiple ways, by shorting to a transfer gate or any other means). Although the poly resistor is outside the bit cell array 620, array word line position impact and bit line leakage may be matched based on the use of the reference column 611. Poly resistors may have different characteristics than an MRAM MTJ. For instance, to obtain a temperature coefficient that is similar to that of an MTJ, a current trim circuitry may be used that has a temperature dependent magnitude of the current that it takes out from the reference bit line 605. By controlling the current being taken out (e.g., current 609), the amount of resistance the sense amplifier 612 sees on the reference bit line 605 may be controlled. While poly resistors may have characteristics that are different from those of an MTJ, by controlling the reference current, Iref (e.g., circuit element 601), the characteristics may become more comparable (or even almost identical) to those of an MTJ. The reference current, Iref, has a temperature coefficient to match the resistance of the parallel high and low-state MTJs across temperature. A poly resistor resistance value can be determined by using any one of multiple methods, such as an average of low state MTJ and high state MTJ resistances or parallel resistance configuration of low and high state MTJ resistances with any offset resistance. A poly resistor can be implemented with a series of small resistors with a small resolution (e.g., 250 or 500 Ohm) covering a wide range (e.g., 2k Ohm) around a center value (e.g., 4k Ohm).

According to another exemplary embodiment, the tracking circuitry 610 may use any type of resistor. For example, an n-well resistor may be used. In some embodiments, the resistor trim may be implemented in any one of several ways. For example, the resistor trim may be implemented using a transfer gate, and/or a PMOS switch or NMOS switch. In some embodiments, rather than using an NMOS mirror in the tracking circuitry 610, a PMOS mirror may be used to inject current. In some embodiments, the tracking circuitry 610 may not contain any current mirror but perform the tracking function by providing a temperature dependent voltage. In some embodiments, a combination of one or more poly resistors and one or more n-well resistors may be used to adjust a temperature coefficient without adjusting a current. In other embodiments, trimmable resistors with different temperature coefficients can be configured/programed to achieve a desired temperature coefficient. Further, any two resistive materials with different temperature coefficients may be used together in order to achieve a desired temperature coefficient.

According to another exemplary embodiment, a switch capacitor may be used in place of the poly resistor. The switch capacitor circuit may control a frequency. For example, a voltage-controlled oscillator may be used to track temperature in several ways.

Figure 7:
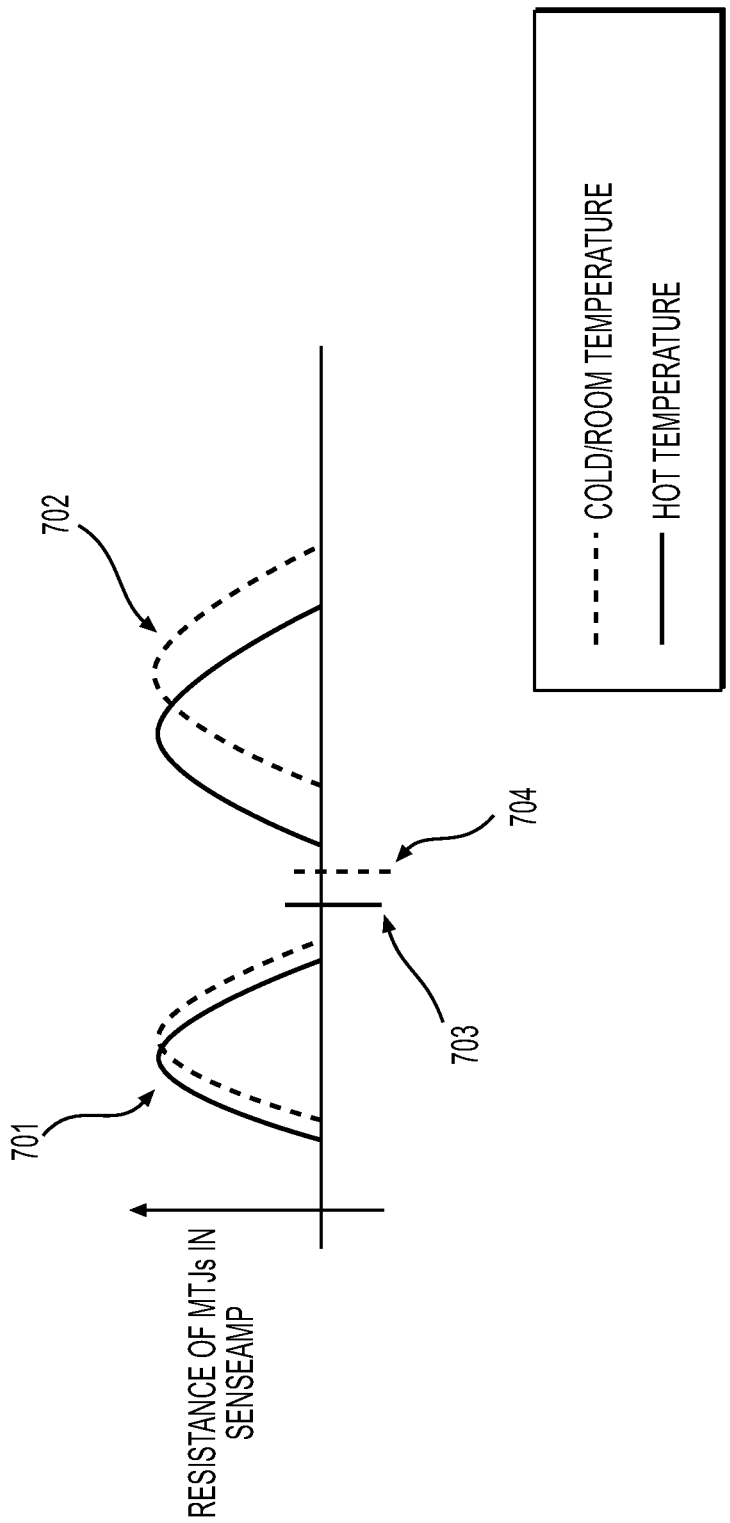
FIG. 7 depicts an exemplary graph illustrating a shift in resistance distribution of low-state MTJs and high state MTJs based on temperature, according to an aspect of the present disclosure.

FIG. 7 depicts an exemplary graph illustrating a shift in resistance of a low-state MTJ and a high-state MTJ based on temperature. The two curves 701 illustrate resistance distributions of a low-state MTJ and the two curves 702 illustrate resistance distributions of a high-state MTJ. The dashed lines illustrate resistance distributions of MTJs at a cold temperature or room temperature. The solid lines illustrate resistance distributions of MTJs at a hot temperature. Line 703 (i.e., midpoint 703) illustrates a midpoint between the solid lines representative of the resistance distributions at the hot temperature. Line 704 (i.e., midpoint 704) illustrates a midpoint between the dotted lines representative of the resistance distributions at the cold temperature or room temperature.

In the low-state distribution represented by the curves 701, the solid curve for the hot temperature does not drift as far away from the dotted curve for the cold temperature as compared to the high-state distribution represented by the curves 702. In some cases of the low-state distribution represented by the curves 701, the solid curve for the hot temperature may not drift any significant amount from the dotted curve for the cold temperature. When the solid curve for the hot temperature moves farther from the dotted curve for the cold temperature as shown in the high-state distribution represented by the curves 702, the midpoint 703 is shifted farther away from the midpoint 704. This may affect the operation of the MRAM device by slowing sensing and/or increasing bit failures. According to an exemplary embodiment, the temperature control coefficient may be controlled to protect against the shifting of the high-state distribution. For example, by taking current off of the reference bit line 605 or by injecting current into the reference bit line 605, as described above in the description of FIG. 6, the temperature effect may be adjusted. The midpoint reference position is adjusted with temperature to maximize the read signal for reading low-state and high-state distributions by the sense amplifier. Thus the reference current, Iref, may be used to control the temperature coefficient.

Figure 8:
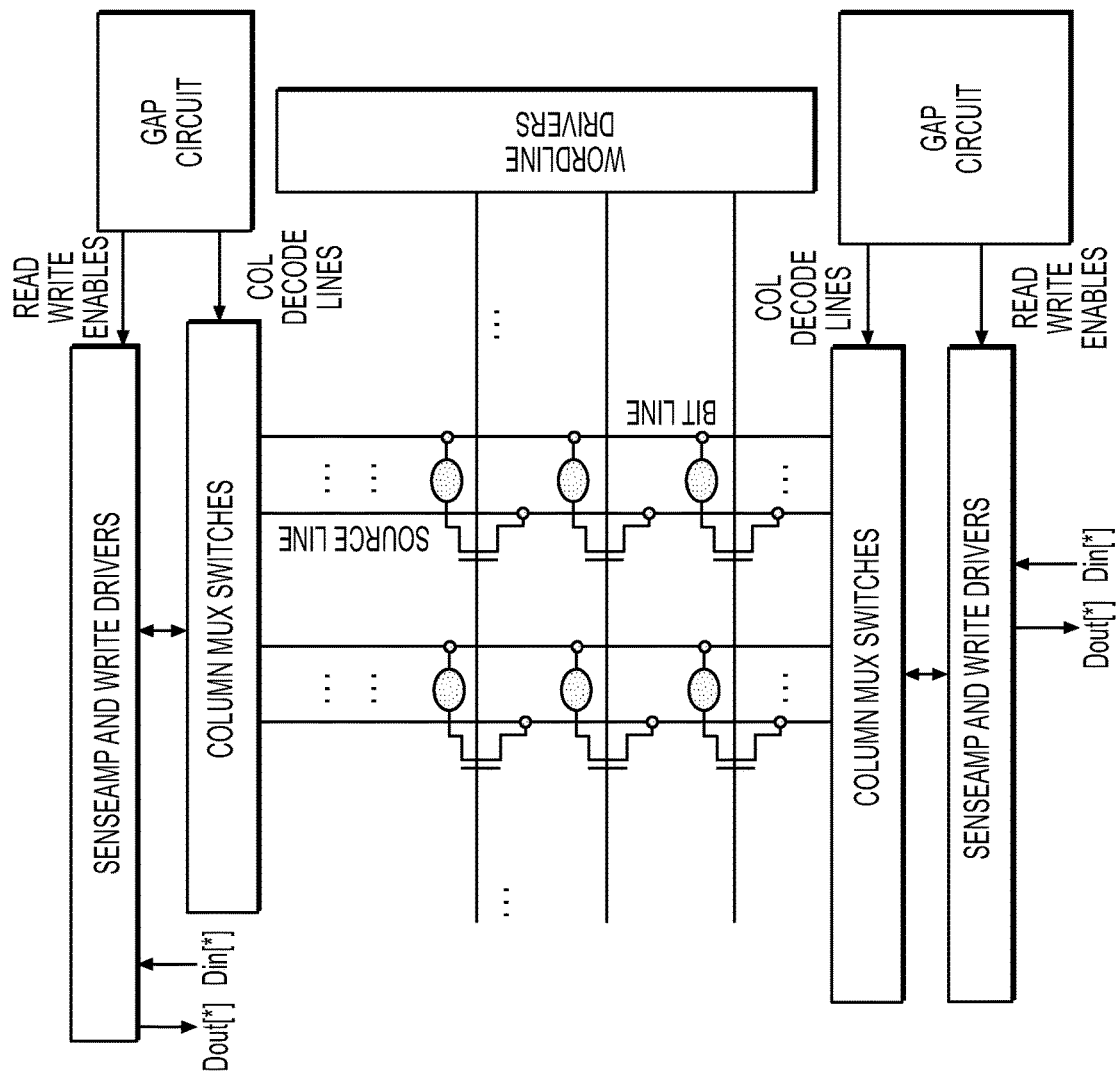
FIG. 8 depicts an exemplary diagram illustrating a memory architecture of an STT-MRAM device, according to an aspect of the present disclosure.

FIG. 8 depicts an exemplary diagram illustrating a memory architecture of an STT-MRAM device, in accordance with an exemplary embodiment. In general, the memory architecture of the STT-MRAM device may include word line drivers, column circuit controls (i.e., gap circuits), read/write circuits comprising sense amplifiers and write drivers, and column multiplexer switches. Word line drivers may generate appropriate word line voltages for word lines, in order to select/activate one or more word lines to access MTJ(s) along the selected word line(s). Gap circuit may generate and send address signals (e.g., column decode line signals, read/write enable signals, etc.) to column multiplexer switches and read/write circuits (e.g., sense amplifiers and write drivers) to, for example, allow for local decoding that determines which bit lines and source lines are to be driven for a particular operation (e.g., read, write, etc.). The local decoding may control the selective driving of the bit lines and source lines by the read/write circuits and may also control the sense amplifiers' selective coupling to, or sensing of, the memory cells for determination of data bits stored therein. More particularly, the read/write enable signals may each provide an indication as to whether memory cells included in the array are to be accessed for a particular operation (e.g., read, write, etc.). The column decode line signals may control the column multiplexer switches to select desired bit line and source line columns. The column multiplexer switches may comprise bit line column multiplexer switches and source line column multiplexer switches. The bit line column multiplexer switches may be configured to provide a unidirectional read current and may be implemented with either a NMOS or a PMOS-type transistor. The bit line column multiplexer switches may be further configured to provide a bidirectional write current and may be implemented with a transfer gate, PMOS-type transistor, or auto-booted NMOS transistor. The source line column multiplexer switches may be configured to provide a bidirectional current and may be implemented with a transfer gate or auto-booted NMOS transistor. In another embodiment, the source line column multiplexer switches may be connected to bit lines in the bit cell array where a local source line bit cell array is used as depicted in FIG. 5.

As alluded to above, read/write circuit may comprise sense amplifiers and write drivers, and may be coupled to bit lines and source lines, to provide appropriate voltages to certain bit lines and source lines used to perform an operation. The selection of the bit lines and the source lines that are driven is based on the address information received from the gap circuit, where the address information may be decoded and used to determine the memory cells to be accessed. If, for example, a target memory cell is included in a page to be accessed, the read/write circuit may use the decoded address to selectively drive those bit lines and source lines suitable for accessing the corresponding MTJ.

Reading the state of an MTJ and determining the bit represented by that state (i.e., a read operation, or a single bit read operation) may be performed by the read/write circuit, which may include a sense amplifier configured to sense a low voltage signal representing the stored bit and amplify it to a recognizable logic level. Further, reading the states of two MTJs and determining the bit represented by those states (i.e., a differential bit read operation) may also be performed by the read/write circuit including the sense amplifier, the sense amplifier being configured to sense the low power signals representing the states of the MTJs and determine the single bit represented by the differing states. Because these two MTJs store complementary states, the comparison may be simple in that one MTJ will have a relatively higher resistance than the other MTJ producing an increased sense signal. As such, the magnitude of the resistance variation in a distribution of MTJs is less important in the case of a differential bit read operation, relative to that of a single bit read operation. To perform the read operations discussed above, a sense amplifier may be connected to each column of MTJs for reading the data values stored therein.

According to an exemplary embodiment, a sense amplifier may include a preamplifier and a latch, and the preamplifier may regulate voltage on a bit line during a read operation.

While exemplary embodiments have been presented above, it should be appreciated that many variations exist. Furthermore, while the description uses STT-MRAM devices that include memory cells in a specific example arrangements, the teachings may be applied to other memory devices having different architectures in which the same concepts can be applied. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

In one embodiment, a magnetoresistive device may include an array comprising a plurality of magnetoresistive devices arranged in a plurality of rows and a plurality of columns, wherein each of the plurality of columns comprises a bit line, the bit line being one of a regular bit line and a reference bit line, wherein each magnetoresistive device of the plurality of magnetoresistive devices is coupled to a bit line and a select device, and wherein the plurality of columns comprise a reference column, the reference column comprising a subset of magnetoresistive devices of the plurality of magnetoresistive devices, each of the subset of magnetoresistive devices being coupled between the reference bit line and a bridge element.

Various embodiments of the magnetoresistive device may include wherein the bridge element provides an electrical short across the first set of magnetoresistive devices in the reference column; further comprising a column selection circuitry configured to select a bit line from the plurality of bit line; further comprising a sense amplifier coupled to the column selection circuitry; further comprising a sense amplifier coupled to the column selection circuitry, the sense amplifier including a first input associated with a plurality of regular bit lines and a second input associated with the reference bit line; further comprising a tracking circuitry connected to the reference bit line, the tracking circuitry being configured to adjust a temperature coefficient based on a reference current associated with the reference bit line; wherein the tracking circuitry includes a current mirror to adjust the temperature coefficient; wherein the tracking circuitry includes an NMOS mirror to adjust the temperature coefficient; wherein the tracking circuitry includes a PMOS mirror to adjust the temperature coefficient; wherein the tracking circuitry includes one or more poly resistors configured for resistance trimming; wherein the magnetoresistive devices in each row of the plurality of rows, including a magnetoresistive device in the reference column, are coupled to a same source line; wherein the source line is positioned at a first conductive layer, the bridge element is positioned at a second conductive layer, and the reference bit line positioned at a third conductive layer; further comprising a sense amplifier including a preamplifier and a latch.

In another embodiment, a magnetoresistive device may include an array comprising a plurality of memory cells arranged in a plurality of rows and a plurality of columns, each memory cell comprising a magnetic tunnel junction (MTJ), each row comprising a word line, and each column comprising a bit line; a column select device configured to select a bit line from the plurality of bit lines; and a sense amplifier comprising a first input corresponding to a selected bit line, a second input corresponding to a reference bit line, and a data output; and a tracking circuitry connected to the first input to the sense amplifier, the tracking circuitry configured to adjust a temperature coefficient based on a reference current associated with the reference bit line, wherein the plurality of columns comprise a reference column, the reference column comprising a conductive element that provides an electrical short across the MTJs in the reference column.

Various embodiments of the magnetoresistive device may include wherein the tracking circuitry comprises a current mirror to adjust the temperature coefficient; wherein the tracking circuitry comprises a poly resistor with trim connected to the first input to the sense amplifier; wherein the tracking circuitry comprises a temperature coefficient current to compensate for a temperature effect and a poly resistor with trim connected to the first input to the sense amplifier; further comprising a second reference bit line adjacent to the reference bit line; wherein the conductive element is a bridge element; wherein the bridge element is a metal bridge element.

The foregoing description of the inventions has been described for purposes of clarity and understanding. It is not intended to limit the inventions to the precise form disclosed. Various modifications may be possible within the scope and equivalence of the application.

We claim:

1. A magnetoresistive memory, comprising:
an array comprising a plurality of select devices arranged in a plurality of rows and a plurality of columns,
wherein the plurality of columns comprises a plurality of bit lines, the plurality of bit lines including a plurality of regular bit lines and a reference bit line,
wherein the plurality of columns comprises a reference column, the reference column comprising a subset of select devices of the plurality of select devices, the subset of select devices comprising an entirety of select devices in the reference column of the array, wherein the reference bit line is coupled to a bridge element, the bridge element being connected to the subset of select devices, wherein the bridge element provides an electrical short or a resistance less than a resistance of a magnetic tunnel junction,
wherein a subset of the plurality of regular bit lines are selectively configured as return bit lines to provide return paths for a read current and a reference current associated with the reference bit line.

2. The magnetoresistive memory of claim 1, further comprising:
a column select device configured to select one of the plurality of regular bit lines from the plurality of bit lines;
a sense amplifier comprising a first input corresponding to the selected one of the plurality of regular bit lines, a second input corresponding to the reference bit line, and a data output; and a tracking circuitry connected to the second input to the sense amplifier, the tracking circuitry configured to adjust a temperature coefficient based on the reference current associated with the reference bit line.

3. The magnetoresistive memory of claim 2, wherein the tracking circuitry comprises a current mirror to adjust the temperature coefficient.

4. The magnetoresistive memory of claim 2, wherein the tracking circuitry comprises (1) a poly resistor with trim connected to the second input to the sense amplifier; and/or (2) a temperature coefficient current to compensate for a temperature effect.

5. The magnetoresistive memory of claim 2, wherein the sense amplifier includes a preamplifier and a latch.

6. The magnetoresistive memory of claim 2, wherein the tracking circuitry includes an NMOS mirror or a PMOS mirror to adjust the temperature coefficient.

7. The magnetoresistive memory of claim 2, wherein the tracking circuitry includes one or more poly resistors configured for resistance trimming.

8. The magnetoresistive memory of claim 1, further comprising a second reference bit line positioned a predetermined number of columns from the reference bit line in the plurality of columns.

9. The magnetoresistive memory of claim 1, wherein the bridge element is a metal bridge.

10. A magnetoresistive memory, comprising:
an array comprising a plurality of electrical connections and a plurality of select devices arranged in a plurality of rows and a plurality of columns,
wherein the plurality of columns comprises a plurality of bit lines, the plurality of bit lines including a plurality of regular bit lines and a reference bit line,
wherein the plurality of columns comprises a reference column, the reference column comprising a subset of the plurality of electrical connections and a subset of select devices of the plurality of select devices, the subset of electrical connections comprising an entirety of electrical connections in the reference column of the array and the subset of select devices comprising an entirety of select devices in the reference column of the array, each of the subset of electrical connections being coupled between the reference bit line and a bridge element, the bridge element being connected across the subset of electrical connections and the subset of select devices, the bridge element being directly connected to the subset of electrical connections in the reference column and the subset of select devices in the reference column at junctions between the subset of electrical connections in the reference column and the subset of select devices in the reference column,
wherein a subset of the plurality of regular bit lines are selectively configured as return bit lines to provide return paths for a read current and a reference current associated with the reference bit line.

11. The magnetoresistive memory of claim 10, further comprising a column selection circuitry configured to select one of the plurality of regular bit lines from the plurality of bit lines.

12. The magnetoresistive memory of claim 11, further comprising a sense amplifier coupled to the column selection circuitry.

13. The magnetoresistive memory of claim 11, further comprising a sense amplifier coupled to the column selection circuitry, the sense amplifier including a first input associated with the one of the plurality of regular bit lines and a second input associated with the reference bit line.

14. The magnetoresistive memory of claim 10, further comprising a tracking circuitry connected to the reference bit line, the tracking circuitry being configured to adjust a temperature coefficient based on the reference current associated with the reference bit line.

15. The magnetoresistive memory of claim 14, wherein the tracking circuitry includes a current mirror to adjust the temperature coefficient.

16. The magnetoresistive memory of claim 14, wherein the tracking circuitry includes (1) an NMOS mirror or a PMOS mirror to adjust the temperature coefficient, and/or (2) one or more poly resistors configured for resistance trimming.

17. The magnetoresistive memory of claim 10, further comprising a sense amplifier including a preamplifier and a latch.

18. A magnetoresistive memory, comprising:
- an array comprising a plurality of electrical connections and a plurality of select devices arranged in a plurality of rows and a plurality of columns,
- wherein the plurality of columns comprises a plurality of bit lines, the plurality of bit lines including a plurality of regular bit lines and a reference bit line,
- wherein each electrical connection of the plurality of electrical connections is coupled to a bit line and a select device,
- wherein the plurality of columns comprises a reference column, the reference column comprising a subset of electrical connections of the plurality of electrical connections and a subset of select devices of the plurality of select devices, the subset of electrical connections comprising an entirety of electrical connections in the reference column of the array and the subset of select devices comprising an entirety of select devices in the reference column of the array, each of the subset of electrical connections being coupled between the reference bit line and a bridge element, the bridge element being connected across the subset of electrical connections and the subset of select devices, and
- wherein a subset of the plurality of regular bit lines are selectively configured as return bit lines to provide return paths for a read current and a reference current associated with the reference bit line.

19. The magnetoresistive memory of claim 18, wherein each of the plurality of electrical connections is a magnetoresistive device.

20. The magnetoresistive memory of claim 19, wherein the magnetoresistive devices in each row of the plurality of rows, including a magnetoresistive device in the reference column, are coupled to a same source line, and
- wherein the same source line is positioned at a first conductive layer, the bridge element is positioned at a second conductive layer, and the reference bit line is positioned at a third conductive layer.

* * * * *